(12) United States Patent
Suzuki et al.

(10) Patent No.: US 8,061,414 B2
(45) Date of Patent: Nov. 22, 2011

(54) BOIL COOLING METHOD, BOIL COOLING APPARATUS, FLOW CHANNEL STRUCTURE, AND APPLIED TECHNOLOGY FIELD THEREOF

(75) Inventors: Koichi Suzuki, Tokyo (JP); Hiroshi Kawamura, Tokyo (JP); Haruhiko Ohta, Fukuoka (JP); Yoshiyuki Abe, Tsukuba (JP)

(73) Assignee: Tokyo University of Science Educational Foundation Administrative Organization, Tokyo (JP)

( * ) Notice: Subject to any disclaimer, the term of this patent is extended or adjusted under 35 U.S.C. 154(b) by 756 days.

(21) Appl. No.: 11/793,535

(22) PCT Filed: Dec. 21, 2005

(86) PCT No.: PCT/JP2005/023520
§ 371 (c)(1),
(2), (4) Date: Oct. 29, 2007

(87) PCT Pub. No.: WO2006/075493
PCT Pub. Date: Jul. 20, 2006

(65) Prior Publication Data
US 2008/0104970 A1    May 8, 2008

(30) Foreign Application Priority Data

Dec. 22, 2004 (JP) ................. 2004-372227
Oct. 25, 2005 (JP) ................. 2005-310164

(51) Int. Cl.
*H05K 7/20* (2006.01)
(52) U.S. Cl. ............. 165/104.33; 165/908; 361/700
(58) Field of Classification Search ............ 165/80.4, 165/104.33, 908; 361/700
See application file for complete search history.

(56) References Cited

U.S. PATENT DOCUMENTS

| | | | | |
|---|---|---|---|---|
| 4,949,164 A | * | 8/1990 | Ohashi et al. | 257/715 |
| 5,021,924 A | * | 6/1991 | Kieda et al. | 361/700 |
| 5,349,499 A | | 9/1994 | Yamada et al. | |

(Continued)

FOREIGN PATENT DOCUMENTS

JP    61-054654 A    3/1986

(Continued)

OTHER PUBLICATIONS

Kokubu, T. et al., "On Subcooled Flow Boiling with Microbubble Emission for Scaleup Heating Surface" Proceedings of 41$^{st}$ Japan Symposium on Heat Transfer, Jun. 2004, vol. 1, pp. 19-20.

*Primary Examiner* — Leonard Leo
(74) *Attorney, Agent, or Firm* — Holtz, Holtz, Goodman & Chick, PC

(57) ABSTRACT

A boil cooling method forms, with a surface of an object to be cooled or a surface of a heating member in close contact with the surface of the object to be cooled made to serve as a cooling surface, a main flow channel and a sub-flow channel for a cooling liquid from the side of the cooling surface in the above-described order, arranges a plurality of nozzles penetrating a partition wall separating the sub-flow channel and the main flow channel and protruding into the main flow channel in a flow channel direction of the main flow channel, causes tip end parts of individual nozzles to be in the vicinity of or in contact with the cooling surface, causes a cooling liquid to circulate to the main flow channel and the sub-flow channel, and cools the cooling surface by boiling of the cooling liquid flowing through the main flow channel, and at the same time, supplies the cooling liquid from the side of the sub-flow channel through each of the nozzles to the vicinity of the cooling surface, and cools the cooling liquid in the main flow channel.

9 Claims, 3 Drawing Sheets

U.S. PATENT DOCUMENTS

| | | |
|---|---|---|
| 5,349,831 A | 9/1994 | Daikoku et al. |
| 5,522,452 A | 6/1996 | Mizuno et al. |
| 5,959,351 A | 9/1999 | Sasaki et al. |

FOREIGN PATENT DOCUMENTS

| | | |
|---|---|---|
| JP | 64-37898 A | 2/1989 |
| JP | 4-147657 A | 5/1992 |
| JP | 4-151860 A | 5/1992 |
| JP | 4-226057 A | 8/1992 |
| JP | 5-136305 A | 6/1993 |
| JP | 6-104358 A | 4/1994 |
| JP | 2002-26210 A | 1/2002 |

* cited by examiner

FIG. 1(a)
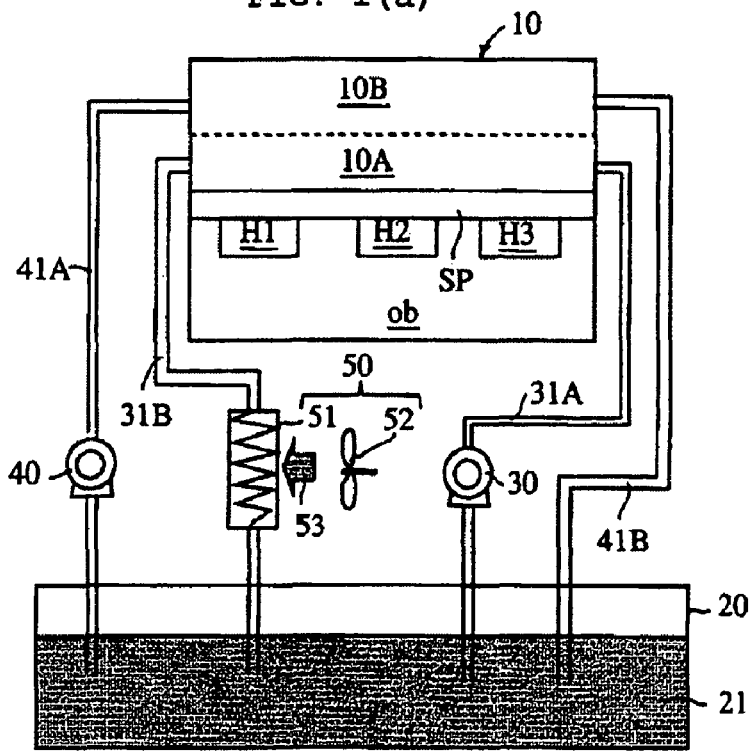
FIG. 1(b)
FIG. 1(c)
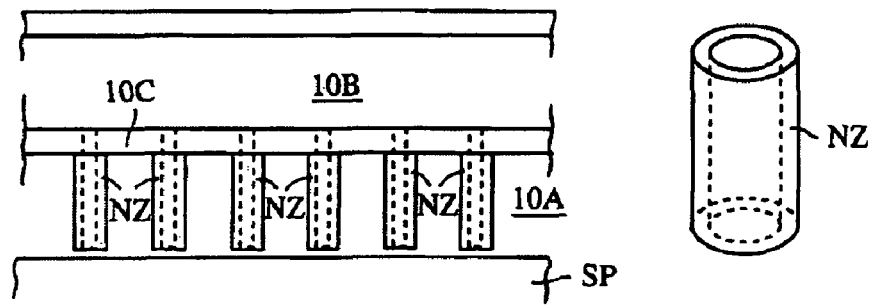
FIG. 2(a)
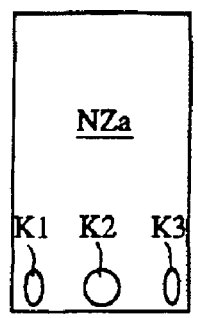
FIG. 2(b)
FIG. 2(c)
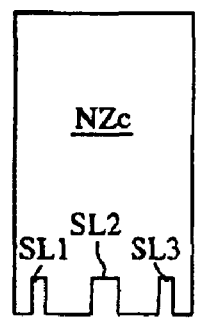

BOIL COOLING METHOD, BOIL COOLING APPARATUS, FLOW CHANNEL STRUCTURE, AND APPLIED TECHNOLOGY FIELD THEREOF

CROSS-REFERENCE TO RELATED APPLICATION

This application is a U.S. National Phase Application under 35 USC 371 of International Application PCT/JP2005/023520 filed Dec. 21, 2005.

TECHNICAL FIELD

The present invention relates to a boil cooling method, a boil cooling apparatus carrying out the boil cooling method, a flow channel structure for use in the boil cooling apparatus, and an application product to which the method, the apparatus or the structure has been applied.

BACKGROUND ART

When heating of liquid is continued, the liquid temperature gradually rises and reaches "a saturation temperature" wherein the liquid temperature does not rise any more. If the liquid is further heated, "vaporization of liquid" occurs in the liquid. This state is boiling, and the above-described saturation temperature is called a boiling point.

In the boiling state, the liquid temperature does not rise, and the energy to be added to liquid by heating is consumed in "vaporizing the liquid inside of the liquid". This heat energy is called "latent heat". The latent heat is extremely large as compared with the heat energy raising the temperature of liquid. Accordingly, by using boiling of liquid, a large cooling effect can be obtained.

Cooling using boiling is called "boil cooling", and heretofore, various boil cooling apparatuses have been proposed.

For example, a boil cooling apparatus of an immersion method has been proposed, which is constituted of a vessel accommodating liquid for cooling and a pipe running through the liquid for cooling in the vessel, and in which boil cooling is performed with a semiconductor element as an object to be cooled immersed in the liquid for cooling, and liquid having a boiling point lower than the liquid for cooling is circulated in the pipe (see, for example, patent document 1).

Boiling phenomenon generally follows the development as described below. The surface of "a heating block" constituted of, for example, metal, etc. is immersed in liquid, and the heating block is heated to raise the heating surface temperature thereof. When the heating surface temperature rises to a certain extent, "a minute bubble about 1 mm or smaller in size" is generated at the surface of the heating block. This state is a state in which the temperature of a liquid layer part of the liquid in contact with the surface of the heating block has reached a saturation temperature, and boiling is occurring at the above-described surface part of the heating block.

As the physical quantity expressing the effect of cooling by boiling of liquid, there is "heat flux". Expressing in the context of examples in the description, heat flux is "the amount of heat transferred to liquid per unit time from a unit area of the surface of the heating block (the surface in contact with the liquid)", and the cooling effect is greater as the heat flux is greater.

As a minute bubble starts to be generated at the surface of the heating block, "the growth rate of heat flux" increases, and if heating the heating block is further continued, the quantity of bubbles generated at the surface of the heating block also increases, and the heat flux also continues to increase at a large growth rate, which however is finally saturated.

"The state in which the heat flux has been saturated" this way is in the state that the heating block surface has been covered with "a large bubble".

That is, if the quantity of minute bubbles generated at a heating surface increases, generated bubbles coalesce to grow to "a large bubble" so large as to be several centimeters in size though depending on the size of the heating surface. A bubble greatly grown in size this way is "a bubble thin in thickness like the squashed one", and if such a large bubble adheres to the surface of the heating block, at the part of the heating surface the large bubble has adhered to, the heating block is not in direct contact with the liquid, so that boiling is inhibited, and thereby the heat flux is saturated. The heat flux at this time is called "critical heat flux".

If the heating block is heated even after the heat flux has reached the critical heat flux, at the part of the surface of the heating block the large bubble has adhered to, the heating surface starts to be dried, and with a rapid rise of the heating surface temperature, the heat flux rapidly decreases, so that the cooling effect rapidly deteriorates. If heating further continues, the heating surface is completely dried at the part thereof covered with the large bubble, and this part turns into "the state wherein the part is covered with a thin film of steam". At this dried part, the heat energy of the heating block is transferred as radiant heat to the liquid, and the heat flux shifts to increase again, however, because the heating surface is not in contact with the liquid, the temperature of the heating block also increases, and if this temperature exceeds a melting point of the heating block, the heating surface "burns out".

The boiling form from the state that a minute bubble starts to be generated at the surface of the heating block until when the heat flux reaches the critical heat flux is called "nucleate boiling", the boiling form from the state that the heat flux is the critical heat flux until when the heat flux decreases and the heat flux shifts to increase again is called "transition boiling", and the boiling form after the change in the heat flux has shifted to increase again is called "film boiling", respectively.

That is, if heating the heating block immersed in liquid is continued, the boiling forms of nucleate boiling, transition boiling, and film boiling sequentially develop, finally leading to burning out of the heating block. Generally, after the state in which the heat flux is the critical heat flux, "the process leading to burning out from the transition boiling through the film boiling" develops extremely rapidly, and control thereof is extremely difficult, so that boil cooling has been heretofore commonly performed in "the area of nucleate boiling in which the heat flux is equal to or below the critical heat flux".

More specifically, in the conventional boil cooling method, it is typical that for example, the heat flux (about 100° C.) of about 100 W/cm$^2$ can be obtained at most to a heating surface 1-2 cm long.

On the other hand, various attempts have been made to obtain a high heat flux, and for example, a cooling apparatus rapidly dissolving boiling bubbles using a nozzle and aiming for a high cooling efficiency has been proposed (see, for example, patent document 2).

The cooling apparatus in the above-described proposal is the one for cooling mainly a semiconductor device as a heat-generating body, and the apparatus carries out a cooling method performing cooling, using two types of nozzles, by emitting a jet of a low temperature refrigerant medium liquid from the first nozzle toward the heat-generating body and at the same time, emitting a jet of the same low temperature refrigerant medium liquid from the second nozzle toward the jet of the low temperature refrigerant medium, that has been emitted from the first nozzle and turned into a high temperature refrigerant medium liquid in a vapor-liquid two-phase state as a result of occurrence of boiling bubbles by the heat of the heat-generating body, to rapidly cool the refrigerant medium liquid emitted from the first nozzle, thereby causing the boiling bubbles to be condensed and dissolved.

According to this proposal, it is envisioned that the heat flux of about 200 W/cm$^2$ can be obtained in the temperature area of about 120° C., however, it is believed that the proposed method is applicable only to cooling of a short heating surface like a semiconductor device.

At the same time, it has been reported that when performing boil cooling while causing cooling liquid to circulate along the cooling surface of an object to be cooled, if the cooling liquid is supplied to the cooling surface after sub-cooling the cooling liquid in advance to "the temperature lower than the saturation temperature", in a certain time frame after the start of cooling, without generating "shifting to transition boiling", the nucleate boiling form is kept and satisfactory boil cooling can be realized up to a considerably high temperature area (see non-patent document 1).

When performing boil cooling while causing cooling liquid to circulate along the cooling surface of an object to be cooled, if the cooling liquid has been sub-cooled, the heat from the cooling surface rapidly raises the temperature of the cooling liquid in contact with the cooling surface up to a saturation temperature, and thereafter, causes boiling. The place where the temperature rises and boiling occurs at this time is "a thin layered part of the cooling liquid in the vicinity of the cooling surface", and it is believed that the cooling liquid in the sub-cooled state, that is, the cooling liquid lower than the saturation temperature in temperature exists in the area outside of this layered part of the cooling liquid.

"The cooling liquid lower than the saturation temperature in temperature", which exists outside of the layered area where boiling is occurring, decreases "the temperature of the cooling liquid in the layered area" in the state of boiling. Due to this temperature decrease, "a bubble in the cooling liquid in the state of boiling is condensed and/or collapsed".

Because heat is further transferred from the heating surface to the liquid, if sub-cooled liquid is used, it is possible to increase the critical heat flux.

If liquid that has been sub-cooled to a great sub-cooling degree is used as the cooling liquid, the temperature at the vapor-liquid boundary face between a coalesced bubble grown in the transition boiling area and the liquid decreases, and the bubble is collapsed by condensing (the phenomenon opposite of the boiling phenomenon) into micro-bubbles, so that it comes to that the liquid is supplied to the heating surface, and thereby cooling can be performed without causing the boiling form to shift from transition boiling to film boiling, and the critical heat flux can be increased more than in ordinary cases. This phenomenon is called "micro-bubble emission boiling".

However, even when performing boil cooling using sub-cooled cooling liquid, with passing of the time that the cooling liquid flows along the cooling surface, the temperature of the whole part of the cooling liquid gradually increases, and the effect of sub-cooling inevitably decreases, so that there is a limit to "performing boil cooling to a large cooling area without causing transition boiling" in a considerably high temperature area.

Recently, the length of a heating surface of an IC package of a high heat-generating density electronic device used in an inverter for power conversion being normally 10-30 cm, a cooling method capable of cooling such a surface to be cooled long in the heating surface is demanded, and further, a cooling method capable of dealing with a wide fluctuation in the heat load for example as in the case that the heat generation immediately rises by rapid acceleration or abnormal driving in an electric automobile is demanded.

Further, it is expected in future that a cooling method enabling obtaining the heat flux of about 300 W/cm$^2$ or more will be required, however, those requirements cannot be met by the conventional cooling method, and the advent of a boil cooling method capable of dealing with those requirements is desired.

Patent document 1: Japanese patent laid-open publication No. 1986-54654

Patent document 2: Japanese patent Laid-open publication No. 1993-136305

Non-patent document 1: "Sub-cooled Flow Boiling with micro-bubble emission" (Proc. 41$^{st}$ Japan Symposium on Heat Transfer, June 2004, Vol. 1, pp. 19-20)

DISCLOSURE OF THE INVENTION

It is an object of the present invention in view of the above-discussed problems to provide a boil cooling method and an apparatus thereof, that enable boil cooling by nucleate boiling in a high temperature area in which transition boiling is possible to occur in the process of boiling phenomenon to a larger cooling flow channel length.

Further, it is an object of the present invention to provide a boil cooling method and an apparatus thereof, that are capable of dealing with the heat generation at a heating surface in the range from a low temperature area to a conventionally unavailable high temperature area and with a wide range of fluctuation in the heat load in continuity as well.

Furthermore, it is an object of the present invention to provide a practical boil cooling method and a practical apparatus thereof, that are capable of devising downsizing/weight-saving and energy saving.

The inventors of the present invention have confirmed, as the result of diligently carrying out intensive studies, that a cooling apparatus, in which a main flow channel and a sub-flow channel serving as the flow channel of a cooling liquid are sequentially arranged adjacent to a cooling surface of an object to be cooled serving as a cooling target, and in which a plurality of nozzles are provided to protrude from the sub-flow channel such that the plurality of nozzles penetrate a partition wall between the main flow channel and the sub-flow channel and the tip end parts thereof come close to or contact the cooing surface, is effective in solving the above-described problems, and have come to create the present invention.

That is, a boil cooling apparatus of the present invention is characterized in that, with a surface of an object to be cooled or a surface of a heating member in close contact with the surface of the object to be cooled made to serve as a cooling surface (hereinafter also called a heating surface), a main flow channel and a sub-flow channel for a cooling liquid are sequentially formed from the side of the cooling surface, a plurality of nozzles penetrating a partition wall separating the sub-flow channel and the main flow channel and protruding into the main flow channel are arranged in a flow channel direction of the main flow channel, and tip end parts of individual nozzles are caused to be in the vicinity of or in contact with the cooling surface.

By the way, as the surface of the heating member in close contact with the surface of the object to be cooled, for example, a surface having the function of spreading the flow of heat by thermal conduction as in a metal plate like a heat spreader closely contacted with a heat generating body, etc. may be given.

It is particularly important that the opening part of the tip end part of the nozzle is placed to correspond to the cooling surface, and further, it is particularly preferable that the nozzle is provided substantially perpendicular to the cooling surface, which is effective in increasing the cooling effect.

As described later, as the nozzle, either a tubular-shaped nozzle having a notch structure at the opening part thereof or a tabular-shaped nozzle not having the notch structure may be used, however, in the case of the nozzle having the notch structure, it is preferable to place the opening part in contact with the cooling surface, and in the case of the nozzle not having the notch structure, it is preferable to place the opening part in the vicinity of the cooling surface.

The nozzle used in the present invention is caused to protrude to the cooling surface and the tip end part of the nozzle is caused to be in the vicinity of or in contact with the cooling surface to miniaturize a bubble with the cooling liquid discharged from the nozzle to cause the effect of the present invention to be brought out, and further, because the nozzle is protruded into the main flow channel, the surface of the nozzle has by necessity the heat radiating fin effect absorbing heat from the liquid increased in temperature by cooling the cooling surface in the main flow channel, so that it is preferable that the material constituting the nozzle has heat conductivity and that the arrangement form, the arrangement density, etc. of the nozzle are appropriately selected and set.

The boil cooling method according to one aspect of the present invention has the characteristic as described below.

It is characterized by causing the cooling liquid to circulate to the main flow channel and the sub-flow channel, cooling the cooling surface with boiling of the cooling liquid flowing through the main flow channel, and at the same time, from the side of the sub-flow channel, through each of the nozzles, supplying the cooling liquid at the side of the sub-flow channel so as to exude in the vicinity of the cooling surface. The boil cooling method described according to this aspect of the present invention is called "a passive cooling method".

It is aimed that the cooling liquid supplied so as to exude like this is caused to contribute to cooling by making the cooling liquid to enter into the vicinity of or the bottom part of a bubble generated in the main flow channel by boiling to separate the bubble from the cooling surface and eliminate the phenomenon of decreasing cooling by the bubble.

A minute bubble about 1 mm in size is generated in the main flow channel at the cooling surface, and if this bubble grows to be about several millimeters in size and adheres to the opening part of the nozzle in the vicinity of the cooling surface, the cooling liquid in the sub-flow channel, in which there is almost no flow, moves to the nozzle, and the cooling liquid in the nozzle is supplied so as to "exude" into the main flow channel at this part. "The cooling liquid to be supplied from the inside of the sub-flow channel to the inside of the main flow channel" effectively eliminates the bubble in the vicinity of the opening part of the nozzle and at the same time, supplies the cooling liquid.

By the exudation effect of the nozzle contacting or in the vicinity of the cooling surface, the cooling liquid is supplied to the bottom part or the periphery of the bubble grown in size, and thereby the bubble is eliminated.

It is preferable that the flow velocity in the main flow channel in "the passive cooling method" is extremely small, and for example, by making the flow velocity to about 0.03-0.06 m/sec, the heat removal of the heat flux of up to about 60-70 W/cm$^2$ is enabled.

Thus, "the passive cooling method" lets the cooling liquid flow at a slow speed in the main flow channel and pass through the sub-flow channel to be put in the state of exuding from the nozzle, and enables achieving the above-described critical heat flux, so that it is extremely practical boil cooling method suitable for energy saving and downsizing/weight-saving.

The boil cooling method described according to another aspect of the present invention is the one using "the phenomenon of micro-bubble emission boiling" described above, and has the characteristic as described below.

With a surface of an object to be cooled or a surface of a heating member in close contact with the surface of the object to be cooled made to serve as a cooling surface, a main flow channel and a sub-flow channel for a cooling liquid are formed from the side of the cooling surface in the above-described order.

A plurality of nozzles penetrating a partition wall separating the sub-flow channel and the main flow channel and protruding into the main flow channel are arranged in a flow channel direction of the main flow channel, and tip end parts of individual nozzles are caused to be in the vicinity of or in contact with the cooling surface.

It is characterized by causing the cooling liquid sub-cooled in advance to a predetermined temperature to circulate to the main flow channel and the sub-flow channel with a pressure in the sub-flow channel increased more than a pressure in the main flow channel, cooling the cooling surface with boiling of the cooling liquid flowing through the main flow channel, and at the same time, supplying the cooling liquid at the side of the sub-flow channel from the side of the sub-flow channel through each of the nozzles by forcibly causing the cooling liquid to erupt in the vicinity of the cooling surface by a pressure difference between the cooling liquid of the main flow channel and the cooling liquid of the sub-flow channel. The boil cooling method described according to this aspect of the present invention is called "an active cooling method".

The cooling liquid flowed through the main flow channel from the initial state cools the cooling surface, and a boiling bubble, which has been thereafter generated by the above-described boiling phenomenon at the cooling surface in the main flow channel and which hinders cooling, is collapsed into minute bubbles by the cooling liquid (sub-cooled liquid) forcibly supplied from the nozzle to the vicinity of the cooling surface in the eruption state, and thereby hindrance is eliminated, and consequently it comes to cool the cooling surface, and in addition, the cooling liquid supplied from the nozzle brings the effect of cooling the cooling liquid flowing through the main flow channel.

The flow velocity of the cooling liquid in "the active cooling method" is preferably adjusted to 0.3-0.6 m/sec in the main flow channel and to 0.5-1.0 m/sec in the sub-flow channel, respectively.

Further, in the boil cooling apparatus of the present invention, for example when the nozzle is provided to protrude such that the tip end part thereof is in the vicinity of the cooling surface, the size of the gap between the tip end part of the nozzle and the cooling surface is not limited in particular as long as the function of miniaturizing a bubble with the supplied cooling liquid and the radiating fin function, the nozzle has, are brought. For example, in the case of the apparatus carrying out only "the passive cooling method" and in the case of the combined apparatus carrying out both of "the passive cooling method" and "the active cooling method", for example about 0.1-1 mm is effective, and in the case of the apparatus carrying out only "the active cooling method", it can be set according to the eruption pressure of the cooling liquid, and for example it is possible to make the gap wider.

As described later, in the active cooling method, even when minute bubbles have been generated in the cooling liquid flow channel, these minute bubbles are instantaneously collapsed into "extremely micro bubbles" about 0.1 mm and smaller, admitting no growth to a large bubble, so that high heat flux boil cooling can be realized at a long heating surface, and further, because the bubbles do not grow greatly, the vibration when the bubbles are collapsed is small, and high heat flux boil cooling of low-vibration and low-noise is enabled.

As described above, "the cooling surface" is the surface of an object to be cooled itself serving as a cooling target or the surface of a heating member. When a heating member is used, the heating member is provided in close contact with the surface of an object to be cooled, and boil cooling of the object to be cooled is performed through the heating member.

The shape of the surface of the cooling surface may be any shape if it enables formation of the main flow channel and the sub-flow channel, and may be a flat surface or a curved surface of a cylinder, etc. It is needless to say that when the surface to be cooled is a flat surface, the formation of the main flow channel and the sub-flow channel is easy.

As the object to be cooled serving as the cooling object, for example, heating members that constitute a high heat-generating density electronic apparatus, a hybrid automobile, an electric automobile, a fuel cell-operated automobile, a power conversion inverter of a fuel cell-operated power generation facility, a power conversion inverter of a power system of a railway electric car or an airplane, etc. or that are attached to those apparatus may be given as examples.

"Sub-cooling" means making the temperature of a cooling liquid to "the temperature lower than the saturation temperature at which boiling occurs in the cooling liquid at the part in contact with the surface to be cooled". The temperature difference between the saturation temperature of the cooling liquid (the temperature at which boiling occurs in the main flow channel) and the temperature of the cooling liquid that has been sub-cooled is called "a liquid sub-cooling degree".

In the above-described active cooling method, it is preferable to set the liquid sub-cooling degree of the cooling liquid, the flow volume, and the pressure difference between the cooling liquid of the main flow channel and the cooling liquid of the sub-flow channel such that the liquid sub-cooling degree of the cooling liquid is 20K and over at the downstream side end of the cooling surface in the main flow channel.

According to another aspect of the present invention, it is possible to "make a switchover according to the cooling condition" between the passive cooling method and the active cooling method. That is, when the temperature of the surface to be cooled is not so high and the growth of a bubble generated at the surface to be cooled is relatively slow, it is possible to effectively inhibit the boiling form from "shifting from the nucleate boiling form to the transition boiling" only by causing "the cooling liquid exuding from the sub-flow channel side to the main flow channel side" through the nozzles to miniaturize the bubble, and without decreasing the heat flux by the transition boiling, a high cooling effect can be realized. In addition, even in the passive cooling method, by increasing the flow velocity of the cooling liquid flowing through the main flow channel and thereby increasing the volume of the cooling liquid supplied to the cooling surface per unit time, the boil cooling form can be maintained up to a considerably high temperature area.

"A switchover according to a cooling condition" between the passive cooling method and the active cooling method can be made, by changing the pressure difference between the cooling liquid of the main flow channel and the cooling liquid of the sub-flow channel, gradually or rapidly, according to the situation, and accordingly, when adopting the method of making a switchover between the passive cooling method and the active cooling method, supplying of the cooling liquid by forcibly causing the cooling liquid to erupt is not necessarily required as in the method of supplying the cooling liquid in the active cooling method.

Under the circumstances that the temperature of the cooling surface has been further increased and "shifting to the transition boiling" cannot be stopped by the passive cooling method, shifting to the transition boiling can be effectively prevented by collapsing a minute bubble by the active cooling method, and satisfactory boil cooling can be realized even in "such a temperature area that transition boiling occurs if the cooling liquid is supplied only to the main flow channel".

Accordingly, in the boil cooling method of the present invention, the passive cooling method is used in the low heat flux area and the active cooling method is used in the high heat flux area, and it is possible to apply the boil cooling method to a simplex cooling apparatus carrying out either the passive cooling method or the active cooling method and a combined cooling apparatus carrying out both of the passive cooling apparatus and the active cooling apparatus as well.

The choice of whether to use the simplex cooling apparatus or the combined cooling apparatus for cooling an object to be cooled is made based on the size of the heat flux of the heat-generating body.

When applied to the combined cooling apparatus, in terms of practicability, it is possible to deal with cooling of a heat-generating body in which the fluctuation in the heat load is such large as that the heat flux changes from the low heat flux area up to the high heat flux area, which is one of the most distinguishing characteristics of the present invention.

According to the experiments by the inventors of the present invention, it has been confirmed as that in practical use, it is preferable to use, as a guide, "the passive cooling method" in the low heat flux area wherein the heat-generating density is smaller than about 60-70 W/cm$^2$ and where the heat-generating density is 70-100 W/cm$^2$ by increasing the flow velocity of the main flow channel to 0.5 m/sec, and "the active cooling method" in the high heat flux area wherein the heat-generating density is greater than that up to about 500 W/cm$^2$.

A switchover from "the passive cooling method" to "the active cooling method" or the reverse switchover can be easily made, for example, by controlling the flow volumes of the cooling liquid of the main flow channel and the sub-flow channel based on a signal of a heat flux sensor installed at the cooling surface.

Further, in the case of the combined boil cooling apparatus, for example, either the method of controlling the flow volumes by providing pumps in the liquid loop to the main flow channel system and the sub-flow channel system, respectively, or the method of controlling the flow volumes by a single pump using a flow volume adjusting valve may be used.

The boil cooling method of the present invention is the method that has enabled performing heat removal to a long heating surface in the range from the low heat flux area to the high heat flux area in continuity with the combined boil cooling apparatus used heretofore, without changing the construction thereof, by using the passive cooling method and the active cooling method.

Thus, this is the method that can deal with cooling of a high heat-generating density device in which the heat generation load changes in the operation thereof, such as an inverter of an electric automobile, etc.

According to another aspect of the present invention, it is preferable to "make the arrangement form and/or the arrangement density of the nozzles to be denser toward the downstream side of the main flow channel and cause the volume of the cooling liquid supplied from the sub-flow channel to be increased toward the downstream side of the main flow channel".

The directions of flow of the cooling liquid may be made "the same between the main flow channel and the sub-flow channel" or "reverse to each other between the main flow channel and the sub-flow channel". When the directions of flow of the cooling liquid are made "reverse to each other between the main flow channel and the sub-flow channel", the downstream side of the main flow channel toward the downstream end thereof corresponds to the upstream side of the sub-flow channel toward the upstream end thereof. In the active cooling method, the sub-cooled cooling liquid is supplied to the main flow channel from the nozzle, however, the temperature of the cooling liquid is closer to the saturation temperature toward the downstream side in the main flow channel, so that as described above, the directions of flow of the cooling liquid are made reverse to each other between the main flow channel and the sub-flow channel and the arrangement density of the nozzles is made to be denser toward the downstream side of the main flow channel to increase the volume of the cooling liquid (sub-cooled at a high liquid sub-cooling degree) supplied from the sub-flow channel toward the downstream side of the main flow channel, and thereby the temperature of the cooling liquid in the main flow channel is effectively decreased, and maintaining the effect of collapsing the bubble is facilitated.

"The arrangement form and/or the arrangement density of the nozzles" has an influence on the above-described heat radiating fin effect of the nozzles too, and it is preferable to adjust the arrangement form and/or the arrangement density of the nozzles considering the characteristic, the flow velocity, etc. of the cooling liquid in the main flow channel.

As the cooling liquid used in the boil cooling method according to an aspect of the present invention, any liquid may be used without limit in particular as long as it is "the one enabling miniaturizing or collapsing a bubble with the cooling liquid exuding from the nozzles or the cooling liquid erupted from the nozzles" described above, and from the viewpoints of easiness in procurement, being low in cost, easiness in handling, harmlessness, chemical/physical safety, etc., water or alcohol, a mixture of water and alcohol, or a fluorine containing inert liquid is suitable. Speaking from the aspect of environmental protection, "water" is particularly suitable as the cooling liquid. As the fluorine containing inert liquid, for example, "FLUORINERT (registered trademark)" (SUMITOMO 3M) is commercially available.

The active cooling method of the present invention is advantageous in that vibration and/or noise is less because a bubble is miniaturized or collapsed before the bubble greatly grows, as described above, and the inventors of the present invention have confirmed that if the above-described mixture is used for the cooling liquid, the effect of decreasing vibration and/or noise can be further enhanced and higher heat flux can be obtained.

That is, the inventors of the present inventor have performed boil cooling according to the active cooling method of the present invention using, as the cooling liquid, liquids in which, as alcohol, ethyl alcohol and propylene alcohol have been mixed with water at the ratio of 5-15% relative to the water, respectively, and confirmed that as compared with when cooling liquid includes only water, for either of the mixture liquids, not only the vibration by pressure when the bubble is collapsed can be decreased about 50% but also the heat flux about 30-50% higher can be obtained.

It is believed that the reason that the vibration by pressure can be decreased like this is because the surface tension of the mixture liquid is smaller than that of water and a bubble is easier to be collapsed, and the vibration by pressure when the bubble is collapsed is smaller as compared with when the cooling liquid includes only water.

Further, it is assumed that the reason that the high heat flux can be obtained is because in boiling of the mixture liquid of water and alcohol, the alcohol portion that is low in boiling point evaporates first at the vicinity of the heating surface at a high temperature, a difference in density is generated between the part of the mixture liquid in the vicinity of the part of the cooling surface a bubble has adhered to and the other part of the mixture liquid, which difference causes a difference in the surface tension in the boundary face between the bubble and the mixture liquid, so that the mixture liquid is drawn by a large surface tension of the part of the vapor-liquid boundary face at the upper part of the bubble low in temperature, and the flow toward the upper part of the bubble (called MARANGONI convection) is being generated.

It is believed that consequently, the cooling liquid is supplied from the cooling liquid side so as to compensate toward the bubble and the part of the heating surface the bubble has adhered to, and vapor-liquid conversion is accelerated, and thereby the heat flux higher than the one obtained when the cooling liquid includes only water can be obtained in the micro bubble emission boiling.

The cooling target in the present invention, that is, "the object to be cooled" described previously is not limited in particular, and from the practical point of view, boil cooling according to the present invention is effective for cooling various semiconductor devices, such as, a reactor core of an atomic reactor, an inverter for a vehicle, etc. For example, in an IGBT using a Si substrate, which is currently widely used, the heat-generating density tends to increase as the output power is increased, and the cooling method of the present invention in extremely effective in performing cooling to such a semiconductor device.

Further, recently, the practical use of "a SiC semiconductor device that can be operated at a high temperature" has been intended, and although a Si-based power device (IGBT) as presently known will have an advantage for some time because the SiC is yet expensive, the present invention is also suitable for cooling a high-temperature operated and high heating-density Si element. Furthermore, the present invention can sufficiently deal with high-load usage of the Si-based power device (IGBT) as presently known.

A flow channel structure of the present invention is used in carrying out the above-described boil cooling method, and has the characteristic as described below.

The flow channel structure includes, with the surface of an object to be cooled or the surface of a heating member in close contact with the surface of the object to be cooled made to serve as a cooling surface, a main flow channel formed integrally with a cooling surface, a sub-flow channel formed so as to overlap and to be integrated with the main flow channel through a partition wall, and a plurality of nozzles formed to penetrate the partition wall from the side of the sub-flow channel and such that tip end parts thereof are in the vicinity of or in contact with the cooling surface.

Thus, the main flow channel and the sub-flow channel are in an integrated construction and the main flow channel is integrated with the cooling surface, so that the cooling surface is "a constituent element of the flow channel structure". In addition, the cooling surface is the surface of the object to be cooled or the surface of the heating member. Accordingly, when the surface of the object to be cooled is made to serve as the cooling surface, it comes to that "the object to be cooled itself serving as the substance of the cooling surface constitutes a part of the flow channel structure".

That is, the flow channel structure can be constructed integrally with the object to be cooled, with the object to be cooled made to serve as a part of the constituent element thereof. Further, when the surface of the heating member is made to serve as the cooling surface, it may be made to perform cooling of the object to be cooled by forming the main flow channel and the sub-flow channel integrally with the heating member to be constructed as "the flow channel structure separate from the object to be cooled" and by arranging the heating member thereof in close contact with the surface of the object to be cooled. The flow channel structure is constituted of material having good heat conductivity. For example, gold, silver, and aluminum have great heat conductivity, and in particular, silver is suitable as the material for the flow channel structure in point of high heat conductivity, however, in terms of cost, aluminum is suitable.

In particular, the nozzle constituted of material having high heat conductivity is effective for bringing the previously described heat radiating fin effect.

Further, as the material for the flow channel structure, it is preferable to use not only those having good heat conductivity, but also those having stable rust resisting property, erosion resisting property, and heat resisting property, and for example, aluminum, stainless, ceramic, etc. that have been treated for rust resisting can be applied.

According to an aspect of the present invention, the flow channel structure may be constructed such that the cooling surface opposing the tip end parts of the plurality of nozzles is a flat and smooth surface, and the tip end parts of the plurality of nozzles are in the vicinity of the flat and smooth surface at a distance of a minute gap.

Further, the flow channel structure may be constructed such that the cooling surface opposing the tip end parts of the plurality of nozzles has a minute concavo-convex structure, and the tip end parts of the plurality of nozzles contact the minute concavo-convex structure. In this case, the minute concavo-convex structure of the surface of the cooling surface may be made "a rough surface structure", and it is also possible to make it "an aggregate of narrow grooves formed in a circular or spiral shape or along the main flow channel".

If the surface of the cooling surface is made in "the minute concavo-convex structure", the surface area of the cooling surface is increased, and the volume of heat moved to the cooling liquid can be increased, and at the same time, the tip end parts of the nozzles can be caused to contact the cooling surface, so that the gap between the tip end parts of the nozzles and the cooling surface is effectively decreased and "exudation of the cooling liquid" is effectively accelerated. Further, it is enabled to use the plurality of nozzles as "a device increasing the strength of the flow channel structure".

According to another aspect of the present invention, the flow channel structure may be constructed such that one or more "minute penetrating holes and/or minute slits and/or notches" are included at the tip end part of each nozzle.

If a nozzle having such minute penetrating holes and/or minute slits and/or notches is used, the cooling liquid flowing from the sub-flow channel is supplied into the main flow channel with the cooling liquid dispersed, and it comes to perform collapsing of bubbles more effectively, which is preferable.

When the nozzle has the above-described minute penetrating holes and/or minute slits and/or notches at the tip end part thereof, even "when the cooling surface is a flat and smooth surface", the tip end part of the nozzle can be caused to contact the cooling surface.

Further, the flow channel structure may be constructed in "a structure in which the flow channel cross section area of the sub-flow channel is made greater than the flow channel cross section of the main flow channel and a dynamic pressure difference is generated by the difference in these flow channel cross section areas such that the pressure of the sub-flow channel is increased".

According to another aspect of the present invention, the flow channel structure may be constructed such that the main flow channel is divided by one or more partition walls "along the cooling surface, in the direction perpendicular to the direction of flow of the cooling liquid". Further, it may be constructed such that the sub-flow channel is divided by one or more partition walls "along a partition wall between the sub-flow channel and the main flow channel, in the direction perpendicular to the direction of flow of the cooling liquid".

The flow channel structure may be constructed in "a structure that the main flow channel and the sub-flow channel are respectively divided in an aligned grid form by the same number of partition walls". "The aligned grid form" is the state that the partition walls of the main flow channel and the partition walls of the sub-flow channel coherently correspond to each other and the arrangement form of the main flow channel parts and the sub-flow channel parts separated by the partition walls is such that the main flow channel parts and the sub-flow channel parts "are not out of alignment with each other in the arrangement direction perpendicular to the direction of flow of the cooling liquid".

According to another aspect of the present invention, the flow channel structure is preferably constructed in "a structure that the arrangement density of the nozzles is made to be denser toward the downstream side of the main flow channel".

The boil cooling apparatus of the present invention includes a flow channel structure and a cooling liquid supplying/circulating device.

"The flow channel structure" includes, with the surface of an object to be cooled or the surface of a cooling member in close contact with the surface of the object to be cooled made to serve as a cooling surface, a main flow channel integrally formed with the cooling surface, a sub-flow channel formed so as to overlap and to be integrated with the main flow channel through a partition wall, and a plurality of nozzles formed to penetrate the partition wall from the side of the sub-flow channel and such that tip end parts thereof are in the vicinity or in contact with the cooling surface.

"A cooling liquid supplying/circulating device" is a device supplying a cooling liquid, which is a liquid circulated to the main flow channel and the sub-flow channel of the flow channel structure and used for cooling the cooling surface, to the flow channel structure and causing the cooling liquid to circulate to the main flow channel and the sub-flow channel. The directions of circulation of the cooling liquid may be the same or reverse to each other between the main flow channel and the sub-flow channel.

According to another aspect of the present invention, the boil cooling apparatus can "set the directions of flow of the cooling liquid in adjacent flow channels (the above-described flow channel parts) reverse to each other". To "set the directions of flow of the cooling liquid in adjacent flow channels reverse to each other" like this is also one manner causing "the cooling liquid to circulate to the main flow channel and the sub-flow channel in directions reverse to each other".

According to another aspect of the present invention, the boil cooling apparatus may be constructed such that the cooling liquid supplying/circulating device includes "a cooling liquid container storing the cooling liquid", "a main flow channel pipe" guiding the cooling liquid in the cooling liquid container through the main flow channel, "a main flow channel pump" circulating the cooling liquid to the main flow channel by the main flow channel pipe, "a sub-flow channel pipe" guiding the cooling liquid in the cooling liquid container through the sub-flow channel, "a sub-flow channel pump" circulating the cooling liquid to the sub-flow channel by the sub-flow channel pipe, and "a condensing device" condensing the cooling liquid passing the main flow channel and returning to the cooling liquid container through the main flow channel pipe, and be made to serve as a boil cooling apparatus for carrying out the passive cooling method.

When carrying out the passive cooling method, sub-cooling the cooling liquid that is supplied to the main flow channel and the sub-flow channel is not necessarily required, however, this does not mean that "performing sub-cooling is excluded" in carrying out the passive cooling method. "Sub-cooling the cooling liquid" is effective in carrying out the passive cooling method too. For example, performing sub-cooling such that the liquid sub-cooling degree of about 10K can be obtained at the downstream side end part of the main flow channel at the cooling surface is extremely effective in the passive cooling method too.

On the other hand, in the case of the combined boil cooling apparatus carrying out the passive cooling method and the active cooling method, because the active cooling method requires using the sub-cooled liquid, the sub-cooled liquid is used by necessity.

According to another aspect of the present invention, the boil cooling apparatus may be constructed such that the cooling liquid supplying/circulating device includes "a cooling liquid container storing the cooling liquid", "a main flow channel pipe" guiding the cooling liquid in the cooling liquid container through the main flow channel, "a main flow channel pump" circulating the cooling liquid to the main flow channel by the main flow channel pipe, "a sub-flow channel pipe" guiding the cooling liquid in the cooling liquid container through the sub-flow channel, "a sub-flow channel pump" circulating the cooling liquid to the sub-flow channel by the sub-flow channel pipe, "a condensing device" cooling and condensing the cooling liquid passing the main flow channel and returning to the cooling liquid container through the main flow channel pipe, "a sub-cooling device" sub-cooling the cooling liquid to be supplied to the main flow channel and the sub-flow channel by the main flow channel pump and the sub-flow channel pump to a predetermined liquid sub-cooling degree, and "a high pressurization device increasing a pressure of the cooling liquid to be circulated to the sub-flow channel more than a pressure of the cooling liquid to be circulated to the main flow channel", and be made to serve as a boil cooling apparatus for carrying out the active cooling method. "The condensing device" in the boil cooling apparatus may have the function of the sub-cooling device or the function of serving as "a part of the sub-cooling device".

The boil cooling apparatus may be constructed such that a pressure changing device changing "a pressure difference between the pressure of the cooling liquid to be circulated to the sub-flow channel and the pressure of the cooling liquid to be circulated to the main flow channel" by the high pressurization device is included, and the passive cooling method and the active cooling method can be switched over according to the cooling condition. In this case, "a sub-cooling device turning on/off device turning on and off the sub-cooling device" may be provided to turn on and off the sub-cooling device according to the cooling condition.

"The high pressurization device increasing the pressure of the cooling liquid to be circulated to the sub-flow channel more than the pressure of the cooling liquid to be circulated to the main flow channel" may be a device having the function of increasing the pressure of the sub-flow channel pump more than the pressure of the main flow channel pump or a device having the function of increasing the pressure of the cooling liquid in the sub-flow channel by adjusting a valve controlling the flow volume at the inlet side and/or at the outlet side of the sub-flow channel and/or decreasing the pressure of the cooling liquid in the main flow channel relatively by adjusting a valve controlling the flow volume at the inlet side and/or at the outlet side of the main flow channel.

For example, it may be constructed such that "a pressure changing device changing at least the pressure of the sub-flow channel pump" is included, and the passive cooling method and the active cooling method can be switched over according to the cooling condition.

According to another aspect of the present invention, the boil cooling apparatus may be constructed such that the cooling liquid has been stored in a cooling liquid container.

As the cooling liquid used in the boil cooling method according to an aspect of the present invention, any liquid may be used without limit in particular as long as it is "the one enabling miniaturizing or collapsing a bubble with the cooling liquid exuding from the nozzles or the cooling liquid erupted from the nozzles", and from the viewpoints of easiness in procurement, being low in cost, easiness in handling, harmlessness, chemical/physical safety, etc., water or alcohol, a mixture of water and alcohol, or a fluorine containing inert liquid is suitable.

Further, there is no limitation in particular also for the object to be cooled serving as "the cooling target" of the boil cooling apparatus, and from the practical point of view as described previously, boil cooling by the boil cooling apparatus of the present invention is extremely effective for cooling a reactor core of an atomic reactor and various semiconductor devices (for example, a semiconductor device using a Si substrate or a SiC substrate, such as an inverter for a vehicle, a Si-IGBT inverter, etc.).

When carrying out the passive cooling method in the boil cooling apparatus, for example, the pressures of the main flow channel pump and the sub-flow channel pump may be the same, and in such a case, the main flow channel pump and the sub-flow channel pump can be combined to "the same pump to be shared". Further, because sub-cooling is not necessarily required in the passive cooling method, the capability of the condensing device (which constitutes at least apart of the sub-cooling device in the active cooling method) can be made small. In addition, when carrying out the passive cooling method, there is an advantage that vibration and/or noise are less.

In the active cooling method carried out in the boil cooling apparatus, a high cooling effect by extremely large heat flux can be realized. Further, by increasing the volume of the cooling liquid to be erupted from the sub-flow channel to the side of the main flow channel, emergency cooling can be dealt with easily and reliably. As described later, it is extremely calm in the active cooling method too.

If switching is performed between the passive cooling method and the active cooling method according to the cooling condition, cooling in which advantages of both of the passive cooling method and the active cooling method have been exploited can be performed by the cooling method suitable for the cooling condition.

As described above, the boil cooling apparatus according to an aspect of the present invention can be used as a cooling device for cooling a product generating heat while in operation.

Specifically, it can be applied, for example, to an electronic element having a heat-generating body or a fuel cell having a heat-generating body, and the electronic element or the fuel cell can be constructed such that a main flow channel of a flow channel structure constituting the boil cooling apparatus is integrally formed at the surface of the heat-generating body. Further, it can be applied to a hybrid automobile, an electric automobile, a fuel cell-operated automobile, a power conversion control apparatus of a fuel cell-operated power generation facility, or a power conversion control apparatus of a power system of a railway electric car or an airplane, in which a high heat-generating density electronic device including an electronic element and a heating member as main constituent elements is installed, and such apparatuses can be configured such that a main flow channel of a flow channel structure constituting the boil cooling apparatus is integrally formed at the surface of a heating member.

As described above, according to the present invention, a boil cooling method, a boil cooling apparatus, and a flow channel structure, that have been heretofore unavailable, can be provided. A minute bubble by boil cooling is generated in the vicinity of a cooling surface, however, according to the present invention, because the cooling liquid flowing through the sub-flow channel is supplied through a nozzle from "the opening part in the vicinity of the cooling surface", the minute bubble generated in the vicinity of the cooling surface is efficiently miniaturized or collapsed and "shifting of the boiling form" to the transition boiling area can be effectively suppressed, so that realizing satisfactory boil cooling by nucleate boiling can be enabled even in "a high temperature area in which transition boiling might occur if it is in a conventional boil cooling method".

BRIEF DESCRIPTION OF THE DRAWINGS

FIG. 1 is a diagram for explaining a boil cooling apparatus according to an embodiment of the present invention.

FIG. 2 is a diagram illustrating three examples of the form of a nozzle.

DESCRIPTION OF SYMBOLS

Figure 3A:
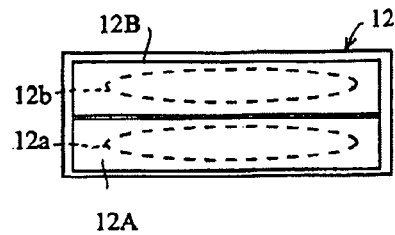
FIG. 3 is a diagram for explaining two examples of the cross section of a main flow channel and a sub-flow channel and an example of the direction of flow of a cooling liquid.

Ob: object to be cooled
10: flow channel structure part (integrated with the object to be cooled to construct a flow channel structure)
10A: main flow channel
10B: sub-flow channel
NZ: nozzle
21: cooling liquid
30: main flow channel pump
40: sub-flow channel pump

BEST MODE FOR CARRYING OUT THE INVENTION

Herein below, embodiments of the present invention are described.

FIG. 1(a) schematically illustrates, as the explanatory diagram, only the main part of a boil cooling apparatus according to an embodiment of the present invention.

In FIG. 1(a), a symbol ob denotes "an object to be cooled". The object to be cooled ob is, for example, a semiconductor device such as an inverter, etc., and includes heat generation sources H1, H2, H3, etc., and a heat spreader SP serving as "a heat radiator" is formed in contact with these heat generation sources. That is, the heat spreader SP is a constituent part of the object to be cooled ob, and the outside surface of the heat spreader SP is "a cooling surface".

A symbol 10 denotes "a flow channel structure part". The flow channel structure part 10 is constructed, with the surface of the heat spreader SP made to serve as the cooling surface in this embodiment, such that a main flow channel 10A and a sub-flow channel 10B for a cooling liquid are sequentially formed in the above-described order from the side of the cooling surface (the surface of the heat spreader SP).

That is, the flow channel structure part 10 is integrated with "the heat spreader SP serving as a constituent element of the object to be cooled ob", so that the flow channel structure part 10 constitutes, together with the object to be cooled ob, "a flow channel structure". The flow channel structure part 10 is constituted of, for example, a material having good heat conductivity, such as aluminum, etc.

FIG. 1(b) illustrates, as the explanatory diagram, an internal structure of the flow channel structure part 10. The main flow channel 10A is formed with the surface of the heat spreader SP as the object to be cooled made to serve as "the cooling surface", and the sub-flow channel 10B is separated from the main flow channel 10A by a partition wall 10C. Further, a plurality of nozzles NZ are formed to penetrate the partition wall 10C from the side of the sub-flow channel 10B and such that tip end parts thereof come close to the cooling surface (the surface of the heat spreader SP).

The dimensions of the main flow channel 10A and the sub-flow channel 10B in the vertical direction in FIG. 1(b) are in the range from several millimeters to 10-some millimeters. Each nozzle NZ is in "a hollow cylinder shape" as illustrated in FIG. 1(c), the internal diameter being about 1-2 mm and the outer diameter being about 2.5-4 mm, and the tip end part thereof is in the vicinity of the surface of the cooling surface through the gap of about 0.1-1 mm. In this embodiment, "the cooling surface is a flat and smooth surface, and each nozzle NZ and the cooling surface are spaced apart by a gap", however, in cases where nozzles like the examples of FIGS. 2(a), (b) and (c) described later are used, the tip end parts of the nozzle may be caused to contact the cooling surface.

That is, "the flow channel structure constituted of the flow channel structure part 10 and the object to be cooled ob" is a flow channel structure including, with the surface of the object to be cooled ob (the surface of the heat spreader SP) made to serve as the cooling surface, the main flow channel 10A integrally formed with the cooling surface, the sub-flow channel 10B formed so as to overlap and to be integrated with the main flow channel 10A through the partition wall 10C, and the plurality of nozzles NZ formed to penetrate the partition wall 10C from the side of the sub-flow channel 10B and such that tip end parts thereof are in the vicinity of the cooling surface. Further, the cooling surface opposing the tip end parts of the plurality of nozzles NZ are a flat and smooth surface, and the tip end parts of the plurality of nozzles NZ are in the vicinity of the flat and smooth surface at a distance of a minute gap.

Returning to FIG. 1(a), a symbol 20 denotes "a cooling liquid container" and a symbol 21 denotes "a cooling liquid", respectively. Further, a symbol 30 denotes a main flow channel pump, a symbol 40 denotes a sub-flow channel pump, symbols 31A and 31B denote "main flow channel pipes", symbols 41A and 41B denote "sub-flow channel pipes", and a symbol 50 denotes "a condensing device".

The main flow channel pump 30, the sub-flow channel pump 40, and the condensing device 50 are controlled by "a controller not illustrated". Control by the controller will be described later. As the cooling liquid 21, water, alcohol, a mixture of water and alcohol, or a fluorine containing inert liquid may be preferably used.

When performing cooling, the cooling liquid 21 in the cooling liquid container 20 is raised by the main flow channel pump 30 and is supplied, through the main flow channel pipe 31A, to the main flow channel 10A of the flow channel structure part 10. The cooling liquid 21 supplied to the main flow channel 10A performs boil cooling of the object to be cooled ob while flowing through the main flow channel 10A. The cooling liquid 21 passed the main flow channel 10A flows through the main flow channel pipe 31B to return to the cooling liquid container 20, which, however, is condensed on the way by the condensing device 50.

The condensing device 50 is constituted of a condensing part 51 incorporated in the main flow channel pipe 31B, and a fan 52 blowing a cooling wind 53 against the condensing part 51. The condensing part 51 is made long in the flow path, and the cooling liquid 21 is cooled by the cooling wind 53 to be condensed while flowing through the condensing part 51, and is returned to the cooling liquid container 20.

On the other hand, the sub-flow channel pump 40 raises the cooling liquid 21 in the cooling liquid container 20 and supplies the cooling liquid 21, through the sub-flow channel pipe 41A, to the sub-flow channel 10B of the flow channel structure part 10. The cooling liquid 21 supplied to the sub-flow channel 10B supplies, while flowing through the sub-flow channel 10B, a part thereof to the main flow channel 10A with the nozzles NZ, and after passing through the sub-flow channel 10B, flows through the sub-flow channel pipe 41B, and is returned to the cooling liquid container 20.

In the boil cooling apparatus illustrated in FIG. 1, the same cooling liquid 21 accommodated in the cooling liquid container 20 is supplied to the main flow channel 10A and the sub-flow channel 10B, however, when a sub-cooled liquid is supplied to the sub-flow channel 10B as a cooling liquid, a sub-cooling device may be arranged at a place on the route to the sub-flow channel 10B from the cooling liquid container 20.

Further, by providing two cooling liquid containers, it may be constructed as the boil cooling apparatus supplying cooling liquid therefrom to the main flow channel 10A and the sub-flow channel 10B, and furthermore, if desired, a sub-cooling device for turning the cooling liquid to be supplied to the sub-flow channel 10B into a sub-cooled liquid may be provided.

That is, the boil cooling apparatus, the embodiment of which is illustrated in FIG. 1, includes a flow channel structure including, with the surface of the object to be cooled ob made to serve as a cooling surface, the main flow channel 10A integrally formed with the cooling surface, the sub-flow channel 10B formed so as to overlap and to be integrated with the main flow channel 10A through the partition wall 10C, and the plurality of nozzles NZ formed to penetrate the partition wall 10C from the side of the sub-flow channel 10B and such that tip end parts thereof come close to the cooling surface, the cooling liquid 21 circulated to the main flow channel 10A and the sub-flow channel 10B of the flow channel structure, and a cooling liquid supplying/circulating device (30, 31A, 31B, 40, 41A, 41B) supplying the cooling liquid 21 to the flow channel structure and causing the cooling liquid 21 to circulate to the main flow channel 10A and the sub-flow channel 10B.

Here, examples of feasible constructions of the flow channel structure part 10 are described.

In the embodiment illustrated in FIG. 1, each nozzle NZ is formed in "a hollow cylinder shape" as illustrated in FIG. 1(c), and the tip end part of the nozzle NZ coming close to the cooling surface is also a flat and smooth surface in the periphery of an opening part thereof.

FIG. 2 illustrates "other examples of the form of the nozzle".

Each of the three types of nozzles NZa, NZb, and NZc illustrated in FIG. 2(a)-FIG. 2(c) is in a hollow cylinder shape, however, has a distinguishing characteristic at the part thereof coming close to the cooling surface, and in the nozzle NZa, more than one minute penetrating holes K1, K2, K3 . . . are formed at the tip end part thereof coming close to the cooling surface, in the nozzle NZb, minute notches KR1, KR2, KR3 . . . are formed at the tip end part thereof coming close to the cooling surface, and in the nozzle NZc, minute slits SL1, SL2, SL3 . . . are formed at the tip end part thereof coming close to the cooling surface.

The positions where these penetrating holes, notches, and slits are formed, and respective numbers are not limited in particular, however, it is practical that about 3-6 in number of them are formed at substantially equal intervals. The form of the nozzle is not limited to the ones described above, and various forms may be allowed, such as "the shape decreasing in the diameter toward the cooling surface", etc.

FIG. 3 is a diagram illustrating examples of the internal form of the flow channel structure part, and illustrates a state of an end face at a hypothetical cross section perpendicular to the direction of flow of the cooling liquid flowing through the flow channel structure part.

In a flow channel structure part 12 illustrated in FIG. 3(a), the inside portion thereof is divided into a main flow channel 12A and a sub-flow channel 12B, each being "a single flow channel". A symbol 12a denotes "a connection part to the main flow channel 12A" of the main flow channel pipe leading the cooling liquid to the main flow channel 10A. A symbol 12b denotes "a connection part to the sub-flow channel 12B" of the sub-flow channel pipe leading the cooling liquid to the sub-flow channel 10B.

Figure 3B:
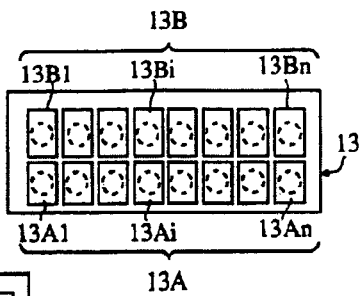

In a flow channel structure part 13 illustrated in FIG. 3(b), the inside portion thereof is divided into a main flow channel 13A and a sub-flow channel 13B. The main flow channel 13A is divided into an "n" number of main flow channel parts 13A1, . . . 13Ai, . . . 13An by one or more partition walls along the cooling surface in the direction perpendicular to the direction of flow of the cooling liquid (the horizontal direction in figure), and the sub-flow channel 13B is also divided into an "n" number of sub-flow channel parts 13B1, . . . 13Bi, . . . 13Bn by one or more partition walls along the partition wall between the sub-flow channel 13B and the main flow channel 13A in the direction perpendicular to the direction of flow of the cooling liquid (the horizontal direction in figure).

That is, the main flow channel 13A and the sub-flow channel 13B are respectively divided with the same number of partition walls. The partition walls of the main flow channel 13A and the partition walls of the sub-flow channel 13B coherently correspond to each other as illustrated in figure, and the arrangement form of the main flow channel part 13Ai and the sub-flow channel part 13Bi separated with these partition walls is not out of alignment with each other in the arrangement direction perpendicular to the direction of flow of the cooling liquid (the horizontal direction in figure).

That is, the main flow channel 13A and the sub-flow channel 13B are respectively divided in "an aligned grid form" by the same number of partition walls.

By the way, in FIG. 3(b), a broken line circle illustrated inside of each main flow channel part indicates "a connection part to each main flow channel part" of the main flow channel pipe leading the cooling liquid to each main flow channel part 13Ai of the main flow channel 13A, and a broken line circle illustrated inside of each sub-flow channel part indicates "a connection part to each sub-flow channel part" of the sub-flow channel pipe leading the cooling liquid to the sub-flow channel 13B.

Further, in the flow channel structure part 13 illustrated in FIG. 3(b), the flow channel cross section area of each sub-flow channel part 13Bi constituting the sub-flow channel 13B is greater than the flow channel cross section area of each main flow channel part 13Ai constituting the main flow channel 13A, and it is constructed in "a structure generating a dynamic pressure difference such that the pressure of the sub-flow channel is increased" by a difference in these flow channel cross section areas. By increasing the pressure of the sub-flow channel by such a dynamic pressure difference, "supplying of the cooling liquid from the sub-flow channel to the main flow channel by exudation of the cooling liquid" can be effectively facilitated.

Figure 3C:
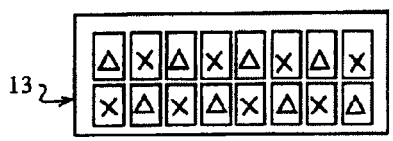

In the embodiment illustrated in FIG. 1, "the direction of flow of the cooling liquid flowing through the main flow channel 10A and the direction of flow of the cooling liquid flowing through the sub-flow channel 10B are reverse to each other". When "the main flow channel and the sub-flow channel are respectively divided in an aligned grid form" as in the flow channel structure part 13 illustrated in FIG. 3(b), the directions of flow of the cooling liquid in all of the main flow channel parts 13Ai constituting the main flow channel 13A may be made "the same direction" and the directions of flow of the cooling liquid in all of the sub-flow channel parts 13Bi constituting the sub-flow channel 13B may be made "the same direction (the same direction as or the opposite direction of the directions in the main flow channel 13A)", however, as illustrated in FIG. 3(c), the directions of flow of the cooling liquid in adjacent flow channel parts may be set "reverse to each other ("the triangle mark" in each flow channel part represents the flow heading from the surface of the sheet for the back of the sheet and "the cross mark" represents the flow heading from the back of the sheet for the surface of the sheet)".

FIG. 4 illustrates examples of the form of the cooling surface.

Figures 4A, 4B, 4C:
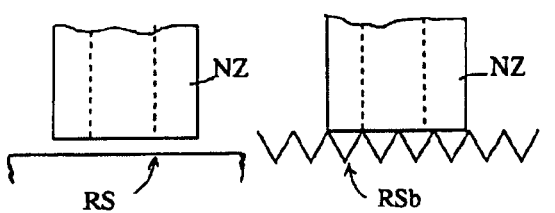
FIG. 4 is a diagram for explaining three examples of the form of the cooling surface.

FIG. 4(a) illustrates the example of the cooling surface described above according to FIG. 1(b) and FIG. 1(c), and a cooling surface RS, to which the tip end part of each nozzle NZ comes close through a minute gap, is a flat and smooth surface.

FIG. 4(b) and FIG. 4(c) illustrate the cases wherein the surface of the cooling surface opposing the tip end parts of a plurality of nozzles has "a minute concavo-convex structure", and the tip end parts of the plurality of nozzles "contact the minute concavo-convex structure".

In the examples illustrated in FIG. 4(b) and FIG. 4(c), the minute concavo-convex structure of cooling surfaces RSb and RSc is an aggregate of narrow grooves formed along the main flow channel (the direction perpendicular to the surface of the sheet).

The shape of the groove may be "a V-shaped groove" as illustrated in FIG. 4(b) or "a groove in a rectangular shape in cross section" illustrated in FIG. 4(c), and further, grooves in various forms may be allowed, such as "a U-shaped groove", "a groove in a semicircular or semi-elliptic shape in cross section", etc. The width of the groove is preferably about "several fractions" of the cross section diameter of the tip end part of the nozzle. Further, the groove may be formed, in addition to the case wherein the groove is "formed along the main flow channel", in a circular or spiral shape. Furthermore, instead of forming grooves, "the cooling surface may be roughed" to be in a rough surface structure.

When the passive cooling method and the active cooling method are carried out in separate apparatuses, as the cooling surface of an object to be cooled, it is effective to use the one with grooves in the case of the passive cooling method and the flat and smooth one in the case of the active cooling method.

In FIG. 4, the nozzle NZ described according to FIG. 1(b) and FIG. 1(c) is illustrated, however, it is needless to say that the nozzles Nza, NZb, NZc, etc., described according to FIG. 2 can be used. As described previously, when using the nozzle NZb or NZc of FIG. 2, the tip end part of the nozzle may be caused to contact the flat and smooth surface RS.

Figure 5:
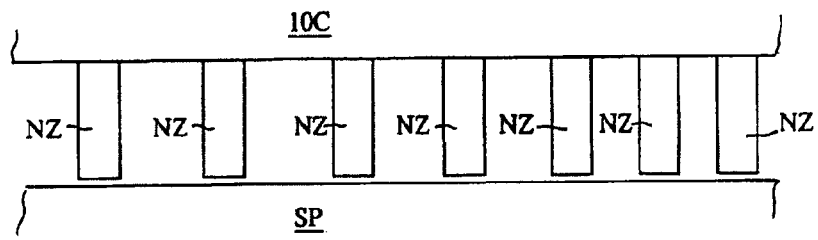
FIG. 5 is a diagram for explaining an example of nozzle arrangement form.

In the embodiment illustrated in FIG. 1, as illustrated in FIG. 1(b), the nozzles NZ are formed "at equal intervals in the direction of flow of the cooling liquid in the main flow channel", however, as in the variation example illustrated in FIG. 5, the arrangement density of the nozzles NZ (the same applies to the cases of the nozzles Nza, NZb, NZc, etc. illustrated in FIG. 2) may be made "to be denser toward the downstream side of the main flow channel (toward right in the figure)".

Now, the description is made with respect to the case of carrying out the passive cooling method in the embodiment illustrated in FIG. 1. As described previously, when carrying out the passive cooling method, the cooling liquid 21 is not necessarily needed to be sub-cooled. In the embodiment of FIG. 1, because the upper part of the cooling liquid container 20 is opened, the pressure of the cooling liquid circulated to the main flow channel and the sub-flow channel is in the state of being close to 1 atmosphere, and pressurization by the pumps 30 and 40 is not so great either. Accordingly, the saturation temperature of the cooling liquid 21 is a temperature in the vicinity of 100° C., and the temperature of the cooling liquid 21 may be made substantially to 100° C.

However, the boil cooling apparatus according to the embodiment of FIG. 1 being the one "carrying out the passive cooling method and the active cooling method by making a switchover", so that "the active cooling method can be immediately carried out" when a switchover from the passive cooling method to the active cooling method has been made, it sub-cools the cooling liquid even when carrying out the passive cooling method.

The liquid sub-cooling degree is set according to the flow volume of the cooling liquid 21, the pressure difference between the cooling liquid of the main flow channel and the cooling liquid of the sub-flow channel when carrying out the active cooling method, etc., such that the liquid sub-cooling degree at the end part of the cooling surface at the downstream side of the main flow channel is 20K or greater. Su-cooling is performed based on the temperature of the cooling liquid 21 in the cooling liquid container 20, the temperature at the exit of the main flow channel, the temperature at the exit of the sub-flow channel, etc. by control of the wind volume of the cooling wind 53 by the fan 52 of the condensing device 50 such that "a predetermined sub-cooling degree" is provided to the cooling liquid 21 in the cooling liquid container 20.

When carrying out the passive cooling method according to the embodiment of FIG. 1, the main flow channel pump 30 and the sub-flow channel pump 40 are operated and the cooling liquid 21 is supplied to the main flow channel 10A and the sub-flow channel 10B, respectively. At this time, the volumes of the cooling liquid 21 supplied by the main flow channel pump 30 and the sub-flow channel pump 40 may be equal. Accordingly, in the case of the boil cooling apparatus carrying out only the passive cooling method, the main flow channel pump 30 and the sub-flow channel pump 40 may be combined to the same pump, and the main flow channel pipe and the sub-flow channel pipe from the cooling liquid container 20 to the pump may be combined to the common one too.

As described above, the cooling liquid 21 is circulated to the main flow channel 10A and the sub-flow channel 10B, and the cooling surface (the surface of the heat spreader SP) is cooled by boiling of the cooling liquid flowing through the main flow channel 10A, and at the same time, the cooling liquid at the side of the sub-flow channel 10B is supplied to the vicinity of the cooling surface, from the side of the sub-flow channel 10B through each of the nozzles NZ, to cool the cooling liquid in the main flow channel 10A.

Figure 6:
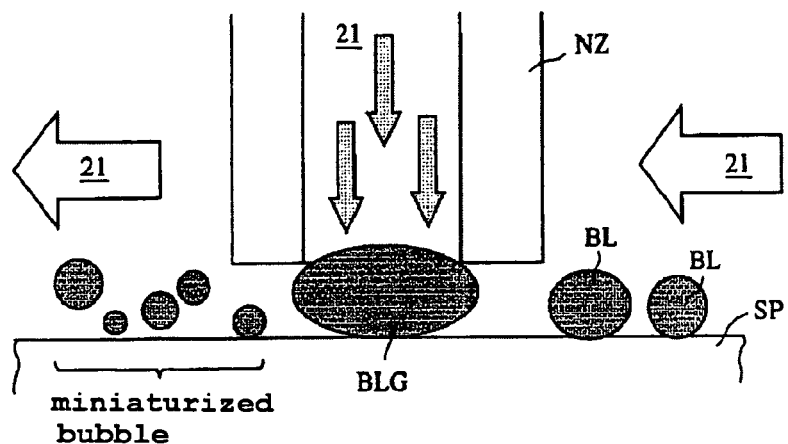
FIG. 6 is a diagram for explaining collapsing of a bubble in the passive cooling method.

FIG. 6 explanatorily illustrates "the state in the main flow channel" when boil cooling is being performed by the passive cooling method. The cooling liquid 21 flows through the main flow channel while contacting the cooling surface in the direction of arrows toward left in figure. At this time, nucleate boiling occurs, and a minute bubble BL is generated from the surface of the cooling surface. The generated bubble BL slightly grows and increases in size, while flowing together with the cooling liquid 21 along the surface of the cooling surface.

When a bubble BLG increased in size as such approaches the opening part of the nozzle NZ as illustrated in the figure, "a meniscus surface" is formed at the opening part of the nozzle as illustrated in the figure, and the pressure at the outside of the meniscus surface (the outside of the bubble BLG) becomes low, so that a capillary phenomenon occurs, and the cooling liquid 21 at the side of the sub-flow channel is supplied into the main flow channel. The supplied cooling liquid miniaturizes "the slightly grown-up bubble BLG". Thus, the slightly grown-up bubble BLG is miniaturized to "micro-bubbles".

Be that the bubble BLG is large, it is at most about several millimeters in dimensions and is not "so large as that the heat flux is saturated and the boiling form is caused to shift to the transition boiling form". Accordingly, in the heat-generating area wherein cooling by the passive cooling method is possible, "miniaturization of a bubble is repeated" while the cooling liquid is flowing through the main flow channel, so that it never occurs that the bubble grows in dimensions "so large as that the boiling form is caused to shift to the transition boiling form", and the nucleate boiling state is kept in a good condition and satisfactory boil cooling can be realized.

That is, when the boil cooling apparatus, the embodiment of which is illustrated in FIG. 1, carries out the passive cooling method, the cooling liquid supplying/circulating device includes the cooling liquid container 20 storing the cooling liquid 21, the main flow channel pipes 31A and 31B guiding the cooling liquid 21 of the cooling liquid container 20 through the main flow channel 10A, the main flow channel pump 30 circulating the cooling liquid 21 to the main flow channel 10A by the main flow channel pipes 31A and 31B, the sub-flow channel pipes 41A and 41B guiding the cooling liquid 21 of the cooling liquid container 20 through the sub-flow channel 10B, the sub-flow channel pump 40 circulating the cooling liquid 21 to the sub-flow channel 10B by the sub-flow channel pipes 41A and 41B, and the condensing device 50 condensing the cooling liquid 21 passing the main flow channel 10A and returning to the cooling liquid container 20 through the main flow channel pipe 41B.

The above-described supplying of the cooling liquid 21 by the capillary phenomenon is a representative "factor causing the cooling liquid to exude from the side of the sub-flow channel to the side of the main flow channel". Another factor causing the cooling liquid 21 to exude is, for example "the dynamic pressure difference".

When carrying out "the active cooling method" in the boil cooling apparatus, the embodiment of which is illustrated in FIG. 1, the cooling liquid 21 sub-cooled in advance to a predetermined temperature is circulated to the main flow channel 10A and the sub-flow channel 10B with the pressure in the sub-flow channel 10B increased higher than "the pressure in the main flow channel 10A", the cooling surface is cooled by boiling of the cooling liquid 21 flowing through the main flow channel 10A, and at the same time, by supplying the cooling liquid at the side of the sub-flow channel 10B from the side of the sub-flow channel 10B through each of the nozzles NZ by forcibly causing the cooling liquid to erupt at the vicinity of the cooling surface by "the pressure difference between the cooling liquid of the main flow channel 10A and the cooling liquid of the sub-flow channel 10B", the cooling surface is cooled while the cooing liquid 21 in the main flow channel 10A is cooled and "minute bubbles generated in the cooling liquid in the main flow channel 10A by boiling" are collapsed.

That is, when carrying out the active cooling method, the cooling liquid 21 is "sub-cooled to a predetermined temperature", and to cause the cooling liquid 21 to circulate with the pressure of the cooling liquid 21 in the sub-flow channel 10B increased higher than the pressure of the cooling liquid 21 in the main flow channel 10A, the pressure of the sub-flow channel pump 40 is increased higher than the pressure of the main flow channel pump 30.

The temperature of the cooling liquid 21 in the cooling liquid container 20 is set, as described previously, according to the flow volume of the cooling liquid 21, the above-described "pressure difference between the cooling liquid of the main flow channel 10A and the cooling liquid of the sub-flow channel 10B", etc., such that the liquid sub-cooling degree at the downstream side end part of the cooling surface is 20K or greater.

In the case of the active cooling method, because the sub-cooled cooling liquid is forcibly supplied from the side of the sub-flow channel to the side of the main flow channel, a minute bubble generated by nucleate boiling collapses to "extreme micro bubbles" about 0.1 mm or smaller hardly before growing, and is caused to disappear. Accordingly, satisfactory boil cooling by nucleate boiling can be realized even to the cooling surface in "a high temperature area such as that transition boiling should be generated" in the passive cooling method.

That is, the boil cooling apparatus, the embodiment of which is illustrated in FIG. 1, is constructed, as the apparatus carrying out the active cooling method, such that the cooling liquid supplying/circulating device includes the cooling liquid container 20 storing the cooling liquid 21, the main flow channel pipes 31A and 31B guiding the cooling liquid 21 of the cooling liquid container 20 through the main flow channel 10A, the main flow channel pump 30 circulating the cooling liquid 21 to the main flow channel 10A by the main flow channel pipes 31A and 31B, the sub-flow channel pipes 41A and 41B guiding the cooling liquid 21 of the cooling liquid container 20 through the sub-flow channel 10B, the sub-flow channel pump 40 circulating the cooling liquid 21 to the sub-flow channel 10B by the sub-flow channel pipes 41A and 41B, the condensing device 50 cooling and condensing the cooling liquid 21 passing the main flow channel 10A and returning to the cooling liquid container 20 through the main flow channel pipe 31B, and a sub-cooling device (not illustrated) sub-cooling the cooling liquid 21 to be supplied to the main flow channel 10A and the sub-flow channel 10B by the main flow channel pump 30 and the sub-flow channel pump 40 to a predetermined liquid sub-cooling degree, and the pressure of the sub-flow channel pump 40 is increased higher than the pressure of the main flow channel pump 30 by the action of a high pressurization device increasing the pressure of the cooling liquid 21 to be circulated to the sub-flow channel 10B higher than the pressure of the cooling liquid 21 to be circulated to the main flow channel 10A.

Further, the boil cooling apparatus, the embodiment of which is illustrated in FIG. 1, is, as described above, the apparatus carrying out the boil cooling method making a switchover between the passive cooling method and the active cooling method according to the cooling condition (the size of the amount of heat generation of the object to be cooled ob).

It is needless to say that in the embodiment of FIG. 1, as the construction of the flow channel structure part 10, those described according to FIG. 2 through FIG. 5 can be appropriately used. In particular, using the flow channel structure part illustrated in FIG. 5 in which "the arrangement density of the nozzles NZ has been made to be denser toward the downstream side of the main flow channel", by making the quantity of the cooling liquid supplied from the sub-flow channel to be increased toward the downstream side of the main flow channel, satisfactory boil cooling can be realized. Further, in the boil cooling apparatus according to embodiment described above, as the cooling liquid 21, "water, alcohol, a mixture of water and alcohol, or a fluorine containing inert liquid" is used.

Figure 7:
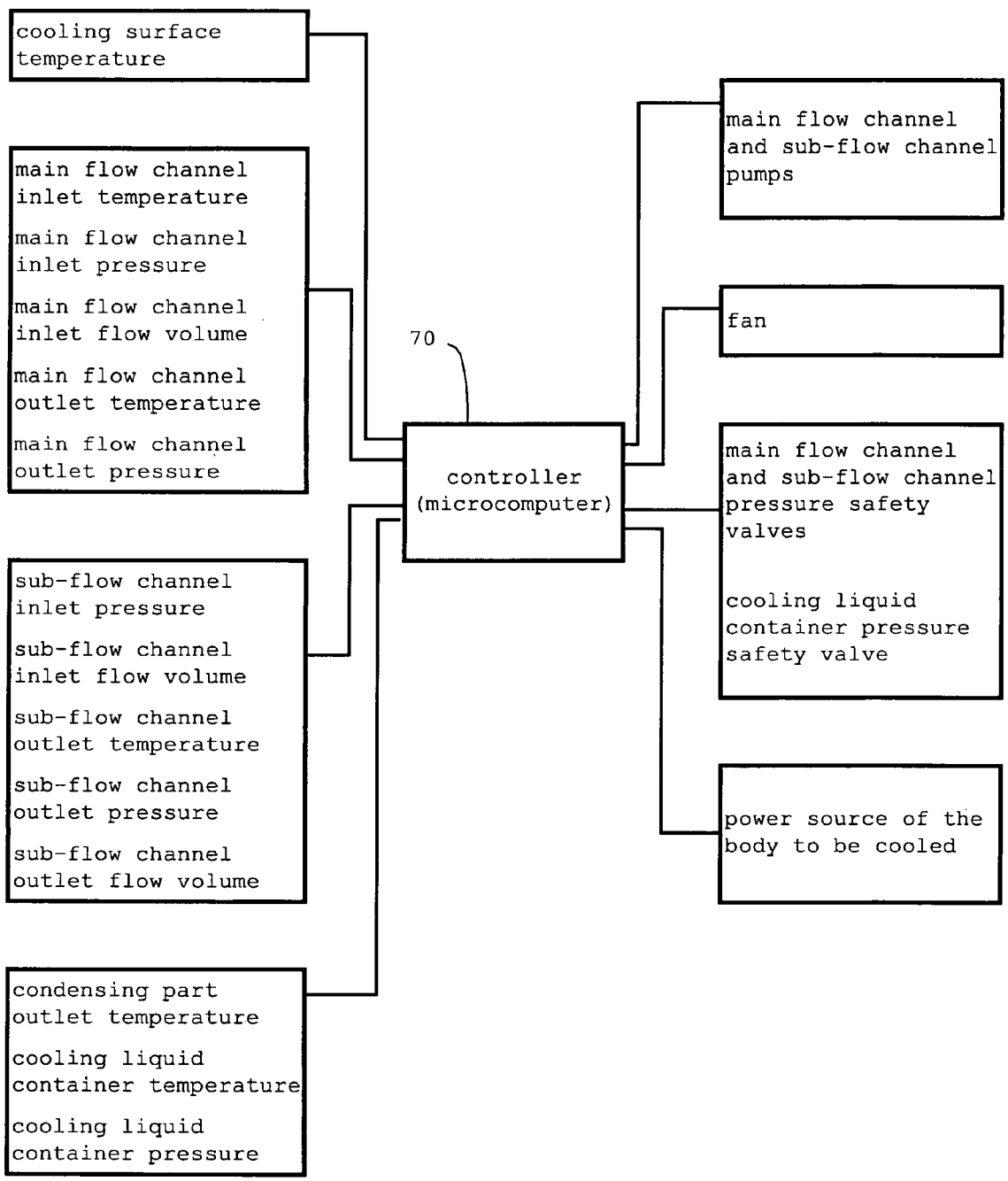
FIG. 7 is a diagram for explaining a control system in the embodiment of the present invention.

As described previously, in the embodiment illustrated in FIG. 1, control by "the controller" is performed. FIG. 7 illustrates a state of control by a controller 70 in a simplified manner as the explanatory diagram. The controller 70 is "a microcomputer". Though the description has not been made above, various sensors are used in the embodiment illustrated in FIG. 1, and "the cooling surface temperature", "the main flow channel inlet temperature, the main flow channel inlet pressure, the main flow channel inlet flow volume, the main flow channel outlet temperature, and the main flow channel outlet pressure", "the sub-flow channel inlet pressure, the sub-flow channel inlet flow volume, the sub-flow channel outlet temperature, the sub-flow channel outlet pressure, and the sub-flow channel outlet flow volume", and "the condensing part outlet temperature, the cooling liquid container temperature, and the cooling liquid container pressure" are detected.

Of those detections, detection of various temperatures is performed with "temperature sensors, such as a thermistor, etc.", detection of various pressures is performed with "pressure instruments, such as a pitot tube, etc.", and detection of various flow volumes is performed with "flow instruments, such as a venturi tube, etc.".

Detection results of those various temperatures, flow volumes, pressures, etc. are input to the controller 70, and according to input information, the controller 70 controls driving of the main flow channel pump 30 and the sub-flow channel pump 40, strength of the driving force of the fan 52 of the condensing device 50, and "main flow channel pressure safety valves, sub-flow channel pressure safety valves, and cooling liquid container pressure safety valves" so that the cooling operation will not be hindered. Further, when the cooling surface temperature has rapidly increased (the case is conceivable wherein the cooling surface temperature has excessively increased and thereby burnout of the cooling surface has occurred), the power source of the object to be cooled is shut off.

The controller 70 changes the driving forces of the main flow channel pump 30 and the sub-flow channel pump 40 according to the height of the cooling surface temperature, and "a switchover between the passive cooling method and the active cooling method" is made with this changing.

That is, the boil cooling apparatus, the embodiment of which is illustrated in FIG. 1, "includes the controller 70 as a pressure changing device changing the pressure of the main flow channel pump, and is capable of making a switchover between the passive cooling method and the active cooling method according to the cooling condition".

Further, it may be made such that when performing cooling by the active cooling method, "the pressure of the cooling liquid 21 circulated to the sub-flow channel 10B is increased higher than the pressure of the cooling liquid 21 circulated to the main flow channel 10A" by controlling the safety valves of the main flow channel 10A and the sub-flow channel 10B with the controller 70, and in this case, the safety valves of the main flow channel 10A and the sub-flow channel 10B constitute "the pressurization device" and a controller controlling the pressurization device constitutes "the pressure changing device".

EXAMPLES

Herein below, the present invention is described giving concrete examples.

Example 1

The construction of an exemplary apparatus is substantially the same as that of the embodiment described according to FIG. 1. It has been assumed that an inverter, which is a semiconductor device, is used as the object to be cooled, and as the heat spreader of the inverter, the one 100 mm in width and 150 mm in length has been assumed.

The case has been assumed that the flow channel structure part as described according to FIG. 1 is constructed on the heat spreader, with the surface of the heat spreader made to serve as the cooling surface, by aluminum with the lengthwise direction of the heat spreader made to serve as the flow channel direction, the flow channel structure part is integrated with the inverter to be constructed as "the flow channel structure", and both of the main flow channel and the sub-flow channel are respectively divided by partition walls in "an aligned grid form" in the direction perpendicular to the direction of flow of the cooling liquid and parallel to the cooling surface, as in the type of the flow channel structure part illustrated in FIG. 3(b). Each main flow channel part and sub-flow channel part divided as above is called "a channel".

Further, it has been assumed that the main flow channel and the sub-flow channel are divided into 5 channels, respectively, the main flow channel and the sub-flow channel are made identical in the shape of each channel, the width (the length in the direction perpendicular to the direction of flow of the cooing liquid and parallel to the cooling surface) is 20 mm, the length is 100 mm, and the height is 5 mm.

Based on the assumption as described above, an experimental flow channel structure including a one-half size model of the assumed channel, that is, an experimental channel of 10 mm in width, 100 mm in length, and 5 mm in height, has been constructed, and as the nozzles penetrating the partition wall separating the sub-flow channel and the main flow channel and protruding into the main flow channel, 9 nozzles have been arranged at the widthwise center part of the experimental channel to be linearly disposed at intervals of 10 mm. Each nozzle is the type illustrated in FIG. 1(c), the internal diameter being 1 mm and the outer diameter being 3 mm, and has been caused to be in the vicinity of the cooling surface separated from the cooling surface by the gap of 1 mm. The cooling surface is a flat and smooth surface.

When "the active cooling method" has been carried out using the above-described experimental flow channel structure and supplying, as the cooling liquid, distilled water at the liquid sub-cooling degree of 40K to the main flow channel at the flow velocity of 0.5 m/sec and to the sub-flow channel at the flow velocity of 0.3 m/sec, satisfactory boil cooling by the heat flux of from 300 W up to 450 W per 1 $cm^2$ has been realized, and burn out of the object to be cooled did not occur.

As a result of this, it has been verified that the boil cooling method of the present invention can be applied to the object to be cooled having the cooling liquid flow length of 100 mm (in the direction of flow of the cooling liquid in the main flow channel) in such a high temperature area of about 155° C. that the heat-removing heat flux of 450 $W/cm^2$ can be obtained.

Example 2

The passive cooling method and the active cooing method have been performed using the flow channel structure, which is substantially the same as the one described in Example 1 in construction except that notched type nozzles of FIG. 2(c) have been used and that stainless steel has been used as the material for the flow channel structure.

When "the passive cooling method" has been performed using distilled water as the cooling liquid and supplying the cooling liquid, under the condition that the liquid sub-cooling degree is 40K and the flow velocity to the main flow channel is 0.05 m/sec, from needle nozzles toward the cooling surface in the state that the cooling liquid exudes from the needle nozzles, the heat-removing heat flux of 60 $W/cm^2$ has been obtained.

Thereafter, the temperature of the cooling surface and the heat flux have been detected with a temperature sensor installed at the cooling surface, and as the amount of heat generation of the cooling surface increases, the flow volume of the cooling liquid has been changed to increase the flow velocity of the main flow channel, and from when the heat-generating density is around 100 $W/cm^2$, the cooling liquid has been supplied to the main flow channel at the flow velocity of 0.55 m/sec, and to the sub-flow channel, while changing the flow velocity according to the amount of heat generation of the cooling surface between 0.3 m/sec and 0.9 m/sec and to switch supplying of the sub-cooled liquid from the nozzles to the cooling surface to the eruption state, to perform "the active cooling method", and then, with vibration and noise hardly occurring, the heat-removing heat flux of maximum 500 $W/cm^2$ has been obtained.

As a result of this, it has been verified that the boil cooling method of the present invention can be applied to an object to be cooled to a large cooling liquid flow length 10 cm long in such a high temperature area of about 160° C. as that the heat-removing heat flux of 500 $W/cm^2$ can be obtained and yet can deal even with a wide range of fluctuation in heat load in continuity.

The passive cooling method of the present invention significantly decreases the cooling liquid drive force by significantly decreasing the flow velocity in the main flow channel, and thereby realizes energy-saving type cooling, and can be applied to a personal utility product area, for example, a small-scale fuel cell-operated power generator for household use. On the other hand, in the active cooling method of the present invention, the cooling liquid of the sub-flow channel is forcibly supplied to the main flow channel continuously, and as described above, "a minute bubble" generated at the cooling surface is instantaneously collapsed into "extreme micro bubbles".

Thus, according to the active cooling method of the present invention, a bubble does not grow materially, and a minute bubble is instantaneously collapsed, so that cooling can be performed in a significantly quite operation state, and high heat flux cooling can be maintained in a stable manner.

In other words, the active cooling method of the present invention miniaturizes a bubble formed on a heating surface before increasing in size and thereby increases the heat removal limit, and in consequence, without causing burnout of a heating member, cooling in a higher temperature area and cooling of an object having a longer heating surface have been enabled.

On the other hand, in the method wherein a bubble is collapsed after having been increased in size, growing and collapsing of a bubble recurs, so that not only high heat flux cooling as the one of the present invention cannot be obtained, but also "a fairly large noise" is made.

Further, the passive cooling method and the active cooling method of the present invention can be applied on one hand to an apparatus carrying out either of the cooling methods, according to the needs, such as the heating member serving as the cooling target, etc., and on the other hand, being applied to an apparatus carrying out both of the passive cooling method and the active cooling method, can deal with the high heat generation of up to 500 $W/cm^2$ and over by changing the supply state of the cooling liquid with pressure adjustment such that supplying of the cooling liquid is performed, when the amount of heat generation is small, in the state that the cooling liquid exudes, when the amount of heat generation is large, in the state that the cooling liquid erupts, and when the heat generation is rapidly increased by rapid acceleration or abnormal driving in an electric automobile for example, in the state that the cooling liquid erupts at the most.

The present invention has the most remarkable characteristic and effect in that the cooling limit of boil cooling in the background art can be significantly enhanced and that dealing with a wide range of fluctuation in heat load has been enabled.

The technology area or the product area (hereinafter referred to as the product) to which the boil cooling apparatus of the present is applied is not limited in particular as long as heat is generated while the product is in operation and a cooling device cooling the heat is a constituent element of the product.

For example, an electronic element having a heat-generating body such as a PC, a fuel cell having a heat-generating body, a hybrid automobile, an electric automobile, a power conversion inverter of a fuel cell-operated power generation facility, a power conversion inverter of a power system of a railway electric car or an airplane, etc. can be given.

That is, in the cases of the electronic element having a heat-generating body such as a PC and the fuel cell having a heat-generating body, they can be commercialized by constructing them such that the main flow channel of the flow channel structure constituting the boil cooling apparatus of the present invention is formed integrally with the surface of the heat-generating body.

Further, in the cases of the hybrid automobile, the electric automobile, the power conversion inverter of a fuel cell-operated power generation facility, and the power conversion control apparatus of a power system of a railway electric car or an airplane, an electronic device including, as the main constituent elements thereof, an inverter for power conversion, a plurality of electronic elements including an electronic package for power control, and a heating member (for example, a heat spreader), is installed, and they can be commercialized by constructing them such that the main flow channel of the flow channel structure constituting the boil cooling apparatus of the present invention is attached to and is formed integrally with the surface of the heating member constituting the electronic device.

As the electronic device like this, generally, a high heat-generating density electronic device is used, and for example, large power, such as 50 kW and over, is handled, so that the amount of heat generation per unit area is large and the heat-generating density is 100 W/cm$^2$ and over, conceivably as large as 300 W/cm$^2$, however, the present invention is suitable also for cooling the electronic device like this.

On the other hand, the flow channel structure of the present invention and the boil cooling apparatus including the flow channel structure as a constituent element thereof can be treated as individual products, respectively.

When treating the flow channel structure as an individual product, when installing the flow channel structure as a constituent element of a boil cooling apparatus, according to the dimensions of the object to be cooled, the optimum attachment place of a heat radiator, and the spacious allowance, the length of a tube, etc. can be adjusted, however, because the cooling liquid is not filled in, when a cooling system including the heat radiator, a liquid transmission pump, etc. has been assembled, it is necessary to fill in the cooling liquid such that air is not put in.

Further, when treating the boil cooling apparatus as an individual product, even when it is the one constructed such that the cooling liquid is stored in advance in a cooling liquid container or the one constructed such that the cooling liquid is not stored in the cooling liquid container, either of them can be commercialized, however, in the case of the one constructed such that the cooling liquid is stored in advance in the cooling liquid container, it can be handled in the state that the cooling liquid has been included in advance, so that the work of filling the cooling liquid and removing air can be omitted.

As described above, the boil cooling apparatus of the present invention can be said as the technology to which a heating member (a heating block) in a wide technology area is applicable and that is expansible for environmental adaptability and energy saving.

The invention claimed is:

1. A boil cooling method for cooling one of a surface of an object to be cooled and a surface of a heating member in close contact with the surface of the object to be cooled, the surface serving as a cooling surface, and the method comprising:

forming a main flow channel for a cooling liquid integrally with the cooling surface, the cooling liquid flowing along the cooling surface in the main flow channel, and forming a sub-flow channel for the cooling liquid, wherein the sub-flow channel is overlapped and integrated with the main flow channel through a partition wall;

arranging a plurality of nozzles penetrating the partition wall separating the sub-flow channel and the main flow channel and protruding into the main flow channel, wherein the plural nozzles are arranged in a flow channel direction of the main flow channel, and tip end parts of the individual nozzles are caused to be in the vicinity of or in contact with the cooling surface; and causing the cooling liquid to circulate to the main flow channel and the sub-flow channel, cooling the cooling surface with boiling of the cooling liquid flowing through the main flow channel, and at the same time, supplying the cooling liquid to the main flow channel from the sub-flow channel through each of the nozzles so as to exude in the vicinity of the cooling surface;

wherein the cooling liquid is made to flow through the main flow channel in a first direction, and the cooling liquid is made to flow through the sub-flow channel in a second direction which is opposite to the first direction;

wherein the cooling surface extends in a horizontal plane, and the cooling liquid is made to flow in the main flow channel in a horizontal direction along the cooling surface;

wherein the main flow channel has separate inlet and outlet ports, and the sub-flow channel has separate inlet and outlet ports; and wherein the cooling liquid is forcibly made to flow in both the main flow channel and the sub-flow channel.

2. The boil cooling method according to claim 1, further comprising, in accordance with a cooling condition, changing a pressure difference between the cooling liquid circulating in the main flow channel, and the cooling liquid circulating in the sub-flow channel, so as to selectively switch between a passive boil cooling method and an active boil cooling method.

3. The boil cooling method according to claim 1, wherein the cooling liquid is forcibly made to flow in both the main flow channel and the sub-flow channel by pumping, using at least one pump.

4. A boil cooling method for cooling one of a surface of an object to be cooled and a surface of a heating member in close contact with the surface of the object to be cooled, the surface serving as a cooling surface, and the method comprising:

forming a main flow channel for a cooling liquid integrally with the cooling surface, the cooling liquid flowing along the cooling surface in the main flow channel, and forming a sub-flow channel for the cooling liquid, wherein the sub-flow channel is overlapped and integrated with the main flow channel through a partition wall;

arranging a plurality of nozzles penetrating the partition wall separating the sub-flow channel and the main flow channel and protruding into the main flow channel, wherein the plural nozzles are arranged in a flow channel direction of the main flow channel, and tip end parts of the individual nozzles are caused to be in the vicinity of or in contact with the cooling surface; and causing the cooling liquid sub-cooled in advance to a predetermined temperature to circulate to the main flow channel and the sub-flow channel with a pressure in the sub-flow channel made higher than a pressure in the main flow channel, cooling the cooling surface with boiling of the cooling liquid flowing through the main flow channel, and at the same time, supplying the cooling liquid to the main flow channel from the sub-flow channel through each of the nozzles by causing the cooling liquid to erupt in the vicinity of the cooling surface by a pressure difference between the cooling liquid in the main flow channel and the cooling liquid in the sub-flow channel;

wherein the cooling liquid is made to flow through the main flow channel in a first direction, and the cooling liquid is made to flow through the sub-flow channel in a second direction which is opposite to the first direction;

wherein the cooling surface extends in a horizontal plane, and the cooling liquid is made to flow in the main flow channel in a horizontal direction along the cooling surface;

wherein the main flow channel has separate inlet and outlet ports, and the sub-flow channel has separate inlet and outlet ports; and wherein the cooling liquid is forcibly made to flow in both the main flow channel and the sub-flow channel.

5. The boil cooling method according to claim 4, further comprising setting a liquid sub-cooling degree of the cooling liquid, a flow volume, and the pressure difference between the cooling liquid in the main flow channel and the cooling liquid in the sub-flow channel such that the liquid sub-cooling degree is not lower than 20K at a downstream side end of the main flow channel.

6. The boil cooling method according to claim 4, further comprising, in accordance with a cooling condition, changing the pressure difference between the cooling liquid circulating in the main flow channel, and the cooling liquid circulating in the sub-flow channel, so as to selectively switch between an active boil cooling method and a passive boil cooling method.

7. The boil cooling method according to claim 4, wherein the cooling liquid is forcibly made to flow in both the main flow channel and the sub-flow channel by pumping, using at least one pump.

8. The boil cooling method according to any one of claim 1 through claim 2, wherein at least one of an arrangement form and an arrangement density of the plurality of nozzles is made to be denser toward a downstream side of the main flow channel so as to cause a volume of the cooling liquid supplied to the main flow channel from the sub-flow channel to be increased toward the downstream side of the main flow channel.

9. The boil cooling method according to any one of claim 1 through claim 2, wherein the cooling liquid is one of water, alcohol, a mixture of water and alcohol, and a fluorine containing inert liquid.

* * * * *